US010714365B2

(12) United States Patent
Iriyama et al.

(10) Patent No.: US 10,714,365 B2
(45) Date of Patent: Jul. 14, 2020

(54) LIQUID PROCESSING APPARATUS

(71) Applicant: TOKYO ELECTRON LIMITED, Minato-ku, Tokyo (JP)

(72) Inventors: Tetsurou Iriyama, Kumamoto (JP); Shinichi Umeno, Kumamoto (JP); Yasuhiro Takaki, Kumamoto (JP); Takami Satoh, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 238 days.

(21) Appl. No.: 15/775,864

(22) PCT Filed: Nov. 2, 2016

(86) PCT No.: PCT/JP2016/082547
§ 371 (c)(1),
(2) Date: May 14, 2018

(87) PCT Pub. No.: WO2017/086158
PCT Pub. Date: May 26, 2017

(65) Prior Publication Data
US 2018/0330974 A1 Nov. 15, 2018

(30) Foreign Application Priority Data

Nov. 16, 2015 (JP) ................................ 2015-224187

(51) Int. Cl.
*H01L 21/304* (2006.01)
*H01L 21/67* (2006.01)

(52) U.S. Cl.
CPC .... *H01L 21/67276* (2013.01); *H01L 21/6708* (2013.01); *H01L 21/67017* (2013.01);
(Continued)

(58) Field of Classification Search
None
See application file for complete search history.

(56) References Cited

FOREIGN PATENT DOCUMENTS

| JP | 2014-099528 | | 5/2014 |
|---|---|---|---|
| JP | 2014-99528 A | * | 5/2014 |

OTHER PUBLICATIONS

International Search Report and Written Opinion for International Application No. PCT/JP2016/082547 dated Dec. 20, 2016, 9 pgs.

* cited by examiner

*Primary Examiner* — Michael E Barr
*Assistant Examiner* — Jason P Riggleman
(74) *Attorney, Agent, or Firm* — Amin, Turocy & Watson, LLP

(57) ABSTRACT

A liquid processing apparatus includes a processing unit, a first supply route, a first device, a second supply route, a second device, a housing, and an external housing. The processing unit processes a substrate by using processing liquid including first and second processing liquids. The first supply route is for supplying the first processing liquid to the processing unit. The first device is for supplying the first processing liquid to the first supply route. The second supply route is for supplying the second processing liquid to the processing unit. The second processing liquid has higher temperature than the first processing liquid. The second device is for supplying the second processing liquid to the second supply route. The housing accommodates the processing unit. The external housing accommodates the first and second devices, and is adjacent to the housing. The external housing includes a partition wall between the first and second devices.

12 Claims, 10 Drawing Sheets

(52) U.S. Cl.
CPC .... *H01L 21/6719* (2013.01); *H01L 21/67051* (2013.01); *H01L 21/67178* (2013.01); *H01L 21/67253* (2013.01)

FIG.2
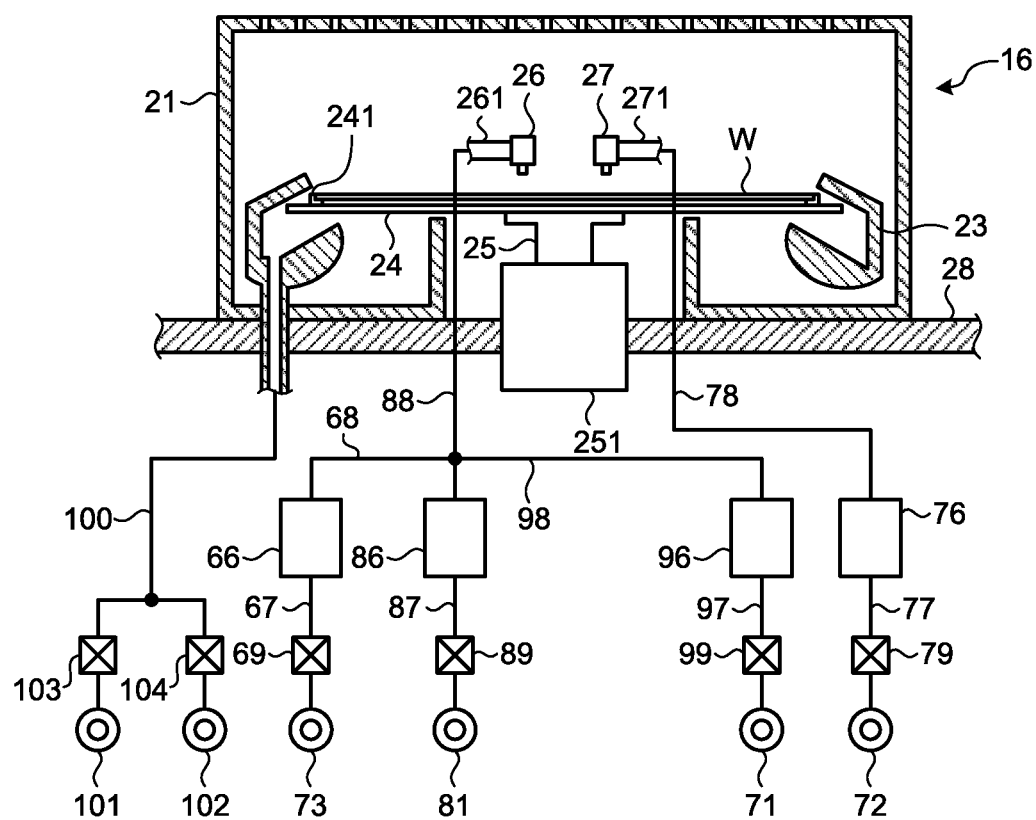
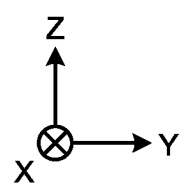

LIQUID PROCESSING APPARATUS

FIELD

The present invention relates to a liquid processing apparatus.

BACKGROUND

Conventionally, there has been known a liquid processing apparatus that performs liquid processing on a substrate such as a semiconductor wafer and a glass substrate.

In the liquid processing apparatus, a plurality of pipes for supplying processing liquids is collectively arranged in a comparatively narrow region in some cases. In this case, when a pipe of processing liquid that is used at a normal temperature or a low temperature is arranged near a pipe of processing liquid that is used at a high temperature, there exists possibility that the temperature of the processing liquid used at the normal temperature or the low temperature is raised by heat release from the pipe of the processing liquid used at the high temperature.

Thus, recently there has been proposed a liquid processing apparatus in which the pipe of the processing liquid used at the high temperature is accommodated in a housing that accommodates a plurality of liquid processing units, the pipe of the processing liquid that is used at the normal temperature or the low temperature is accommodated in an external housing that is adjacent to the housing, and a tank that retains the processing liquid having the high temperature is arranged outside of the housing and the external housing (see Patent Literature 1).

CITATION LIST

Patent Literature

Patent Literature 1: Japanese Laid-open Patent Publication No. 2014-099528

SUMMARY

Technical Problem

However, when the tank for retaining the processing liquid having the high temperature etc. is arranged in the external housing, which is described in the above-mentioned conventional technology, in order to improve space saving of the apparatus, for example, there exists a problem that the processing liquid used at the normal temperature or the low temperature and the processing liquid used at the high temperature, which flow through devices such as pipes, thermally affect each other.

An object of one aspect of the embodiment, in view of the above-described situations, is to provide a liquid processing apparatus that is able to reduce thermal effects between devices for supplying processing liquids that are accommodated in the same external housing.

Solution to Problem

A liquid processing apparatus according to an aspect of an embodiment includes a processing unit, a first supply route, a first device, a second supply route, a second device, a housing, and an external housing. The processing unit processes a substrate by using processing liquid including first and second processing liquids. The first supply route is configured to supply the first processing liquid to the processing unit. The first device is used for supplying the first processing liquid to the first supply route. The second supply route is configured to supply the second processing liquid to the processing unit. The second processing liquid has higher temperature than the first processing liquid. The second device is used for supplying the second processing liquid to the second supply route. The housing accommodates the processing unit. The external housing accommodates the first and second devices. The external housing is adjacent to the housing. The external housing includes a partition wall between the first and second devices.

Advantageous Effects of Invention

According to one aspect of the embodiment, it is possible to reduce thermal effects between devices for supplying processing liquids that are accommodated in the same external housing.

BRIEF DESCRIPTION OF DRAWINGS

FIG. 2 is a diagram illustrating a configuration of a processing unit.

DESCRIPTION OF EMBODIMENT

Hereinafter, an exemplary embodiment of a liquid processing apparatus disclosed in the present application will be described in detail with reference to the accompanying drawings. In addition, the illustrative embodiment disclosed below is not intended to limit the present invention.

1. Schematic Configuration of Substrate Processing System

Figure 1:
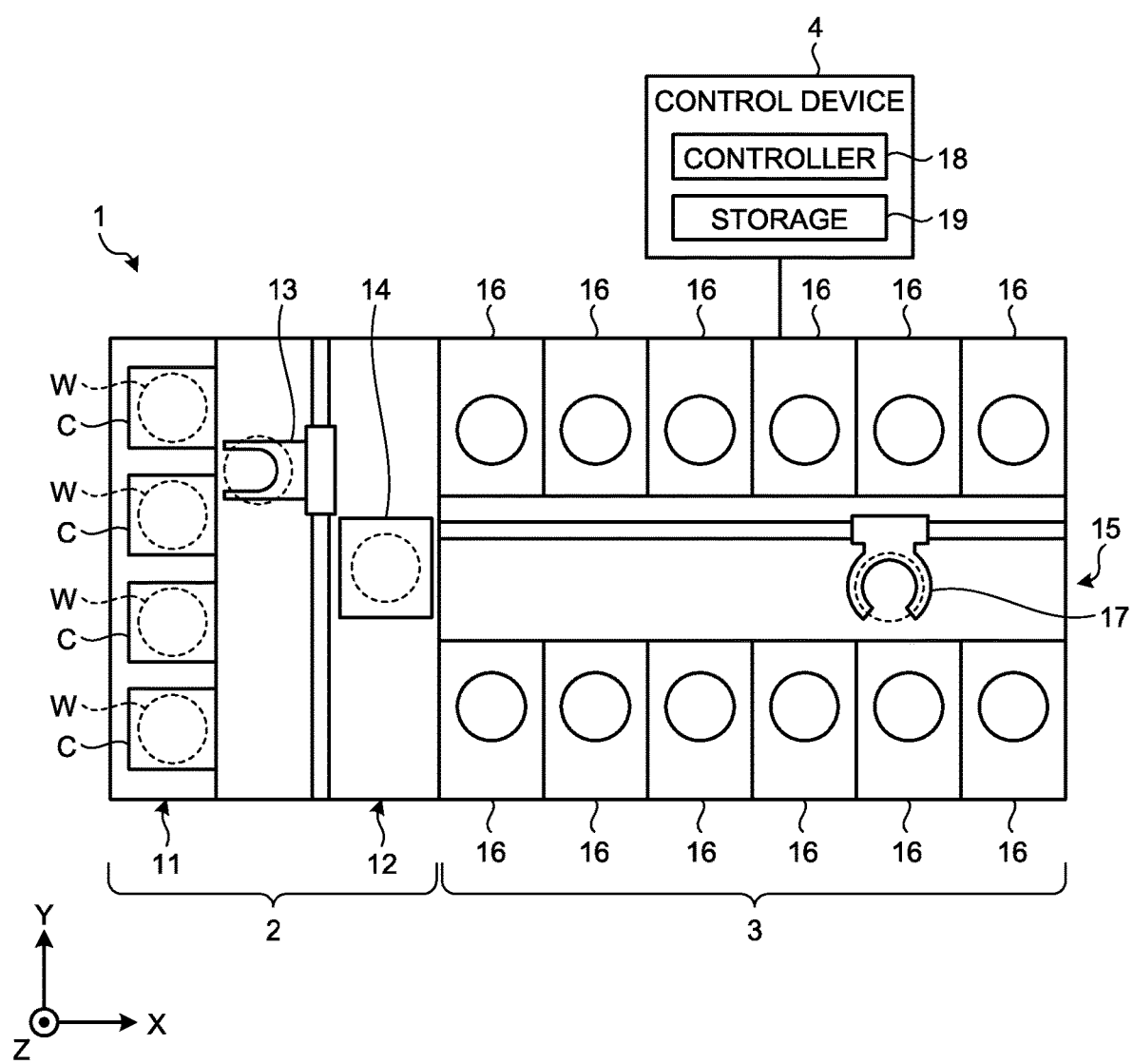
FIG. 1 is a diagram illustrating a schematic configuration of a substrate processing system according to a present embodiment.

FIG. 1 is a diagram illustrating a schematic configuration of a substrate processing system according to the present embodiment. Hereinafter, in order to make a positional relationship clear, X-axis, Y-axis, and Z-axis will be defined to be perpendicular to each other and the positive Z-axis direction is regarded as a vertically upward direction.

As illustrated in FIG. 1, a substrate processing system 1 includes a carry-in/out station 2 and a processing station 3. The carry-in/out station 2 and the processing station 3 are provided adjacent to each other.

The carry-in/out station 2 includes a carrier placing section 11 and a transfer section 12. In the carrier placing section 11, a plurality of carriers C are placed to horizontally accommodate a plurality of substrates, namely, semiconductor wafers (hereinafter, wafer W) in the present embodiment.

The transfer section 12 is provided adjacent to the carrier placing section 11, and includes therein a substrate transfer device 13 and a delivery unit 14. The substrate transfer device 13 includes a wafer holding mechanism configured to hold the wafer W. The substrate transfer device 13 is movable horizontally and vertically and is pivotable around a vertical axis, and transfers the wafer W between the corresponding carrier C and the delivery unit 14 by using the wafer holding mechanism.

The processing station 3 is provided adjacent to the transfer section 12. The processing station 3 includes a transfer section 15 and a plurality of processing units 16. The plurality of processing units 16 are provided side by side at both sides of the transfer section 15.

The transfer section 15 includes therein a substrate transfer device 17. The substrate transfer device 17 includes a wafer holding mechanism configured to hold the wafer W. The substrate transfer device 17 is movable horizontally and vertically and is pivotable around the vertical axis, and transfers the wafer W between the delivery unit 14 and the corresponding processing unit 16 by using the wafer holding mechanism.

Each of the processing units 16 performs a predetermined substrate processing on the wafer W transferred by the substrate transfer device 17.

The substrate processing system 1 further includes a control device 4. The control device 4 is a computer, for example. The control device 4 includes a controller 18 and a storage 19. The storage 19 stores therein a program for controlling various types of processes that are performed in the substrate processing system 1. The controller 18 reads out and executes the program stored in the storage 19 to control operations of the substrate processing system 1.

The program may be recorded in a computer-readable recording medium and thus may be installed into the storage 19 of the control device 4 from the recording medium. A computer-readable recording medium includes, for example, a hard disk (HD), a flexible disk (FD), a compact disc (CD), a magneto-optical disk (MO), and a memory card among other things.

In the substrate processing system 1 configured as described above, the substrate transfer device 13 of the carry-in/out station 2 first takes out the wafer W from one of the carriers C placed in the carrier placing section 11, and places the taken wafer W on the delivery unit 14. The wafer W placed on the delivery unit 14 is taken out from the delivery unit 14 by the substrate transfer device 17 of the processing station 3, and is carried into one of the processing units 16.

The wafer W carried into the processing unit 16 is processed by the processing unit 16, and then is carried out from the processing unit 16 and placed on the delivery unit 14 by using the substrate transfer device 17. Then, the processed wafer W placed on the delivery unit 14 is returned to the corresponding carrier C in the carrier placing section 11 by using the substrate transfer device 13.

2. Configuration of Processing Unit

Next, a configuration of the processing unit 16 will be explained with reference to FIG. 2. FIG. 2 is a diagram illustrating a configuration of the processing unit 16.

As illustrated in FIG. 2, the processing unit 16 (equivalent to one example of "processing unit") processes the wafer W by using processing liquid. Specifically, the processing unit 16 includes: a rotation plate 24 that holds the wafer W to be rotatable; and a rotation supporting part 25 that supports the rotation plate 24 from a lower surface side of the rotation plate 24 and rotates the rotation plate 24 by using a rotary motor (not illustrated).

The rotation plate 24 is a member having a discoid shape, and a plurality of holding parts 241 for holding the wafer W is provided on a surface of the rotation plate 24. The wafer W is held, via a gap, at a position higher than a surface of the rotation plate 24. The rotation supporting part 25 is held to be rotatable by a bearing part 251. The bearing part 251 is provided on a baseplate 28 on which the processing unit 16 is placed.

The processing unit 16 includes a first nozzle 26 and a second nozzle 27. The first nozzle 26 is a nozzle that supplies Sulfuric acid Hydrogen Peroxide Mixture (SPM) and HDIW to the surface of the wafer W. The SPM is mixed solution of sulfuric acid and hydrogen peroxide and HDIW is deionized water that is heated to a predetermined temperature (50 to 60 degrees Celsius).

The first nozzle 26 is supported by a first arm 261, and is movable between a processing position above the wafer W held by the rotation plate 24 and a retreat position that is retreated from this processing position. The second nozzle 27 is supported by a second arm 271, and is movable between the above-mentioned processing position and the retreat position.

The first nozzle 26 is connected to a downstream side branch pipe 88 via the first arm 261. The downstream side branch pipe 88 is connected with a second flow control unit 86 that is corresponding to a second main pipe 81.

Each of the second flow control unit 86; and a first flow control unit 76, a third flow control unit 66, and a fourth flow control unit 96 that are to be mentioned later is a device obtained by collecting flow controlling devices including a flow adjusting valve and a flow meter among other things. The second flow control unit 86 is connected to the second main pipe 81 via an upstream side branch pipe 87 and an opening/closing valve 89. The second main pipe 81 (equivalent to one example of "second supply route") is a pipe through which sulfuric acid (equivalent to one example of "second processing liquid") having a high temperature (for example, approximately 100 to 150 degrees Celsius) flows.

The downstream side branch pipe 88 is connected with a downstream side branch pipe 98. The downstream side branch pipe 98 is connected with the fourth flow control unit 96 that is corresponding to a fourth main pipe 71. The fourth flow control unit 96 is connected to the fourth main pipe 71 via an upstream side branch pipe 97 and an opening/closing valve 99. The fourth main pipe 71 is a pipe through which hydrogen peroxide having a normal temperature flows.

The downstream side branch pipe 88 is further connected with a downstream side branch pipe 68. The downstream side branch pipe 68 is connected with the third flow control unit 66 that is corresponding to a third main pipe 73. The third flow control unit 66 is connected to the third main pipe 73 via an upstream side branch pipe 67 and an opening/closing valve 69. The third main pipe 73 (equivalent to one example "third supply route") is a pipe through which HDIW (equivalent to one example of "third processing liquid") flows.

The second nozzle 27 is a nozzle that supplies, to the surface of the wafer W, DIW (equivalent to one example of "first processing liquid") that is deionized water having the normal temperature (approximately 23 to 25 degrees Celsius).

The second nozzle 27 is connected to a downstream side branch pipe 78 via the second arm 271. The downstream side branch pipe 78 is connected with the first flow control unit 76 that is corresponding to a first main pipe 72. The first flow control unit 76 is connected to the first main pipe 72 via an upstream side branch pipe 77 and an opening/closing valve 79. The first main pipe 72 (equivalent to one example of "first supply route") is a pipe through which DIW flows.

As described above, each of the processing units 16 according to the present embodiment includes two nozzles of the first nozzle 26 and the second nozzle 27. The first nozzle 26 discharges SPM that is processing liquid having the high temperature. The second nozzle 27 discharges DIW that is processing liquid having the normal temperature. Thus, it is possible to reliably prevent a rise in temperature of DIW compared with a case where SPM and DIW are discharged from the same nozzle.

Each of the processing units 16 includes: the first arm 261 that supports the first nozzle 26; and the second arm 271 that supports the second nozzle 27. Thus, it is possible to reliably prevent a rise in temperature of DIW compared with a case where the first nozzle 26 and the second nozzle 27 are provided on the same arm.

Each of the processing units 16 further includes a cup 23 that receives chemical liquid scattered from the rotating wafer W so as to discharge the received chemical liquid to the outside thereof. The cup 23 is a ring-shaped member that is formed so as to surround the wafer W held by the rotation plate 24, and is able to discharge internal processing liquid via a main discharge pipe 100 that is connected with a bottom surface of the cup 23.

The main discharge pipe 100 branches on a downstream side thereof to be individually connected to a recovery pipe 101 for recovering SPM via an opening/closing valve 103 and a discharge pipe 102 for discharging SPM via an opening/closing valve 104.

A casing 21 is provided on an outer side of the cup 23. An opening/closing door (not illustrated) is provided on a surface facing the substrate transfer device 17 (see FIG. 1) of the casing 21, and the substrate transfer device 17 is able to enter the inside of the casing 21 by opening this opening/closing door.

3. Configuration of External Housing

The substrate processing system 1 according to the present embodiment further includes an external housing. The external housing accommodates various devices for supplying to the processing units 16 the above-mentioned sulfuric acid, hydrogen peroxide, DIW, and HDIW.

Figure 3:
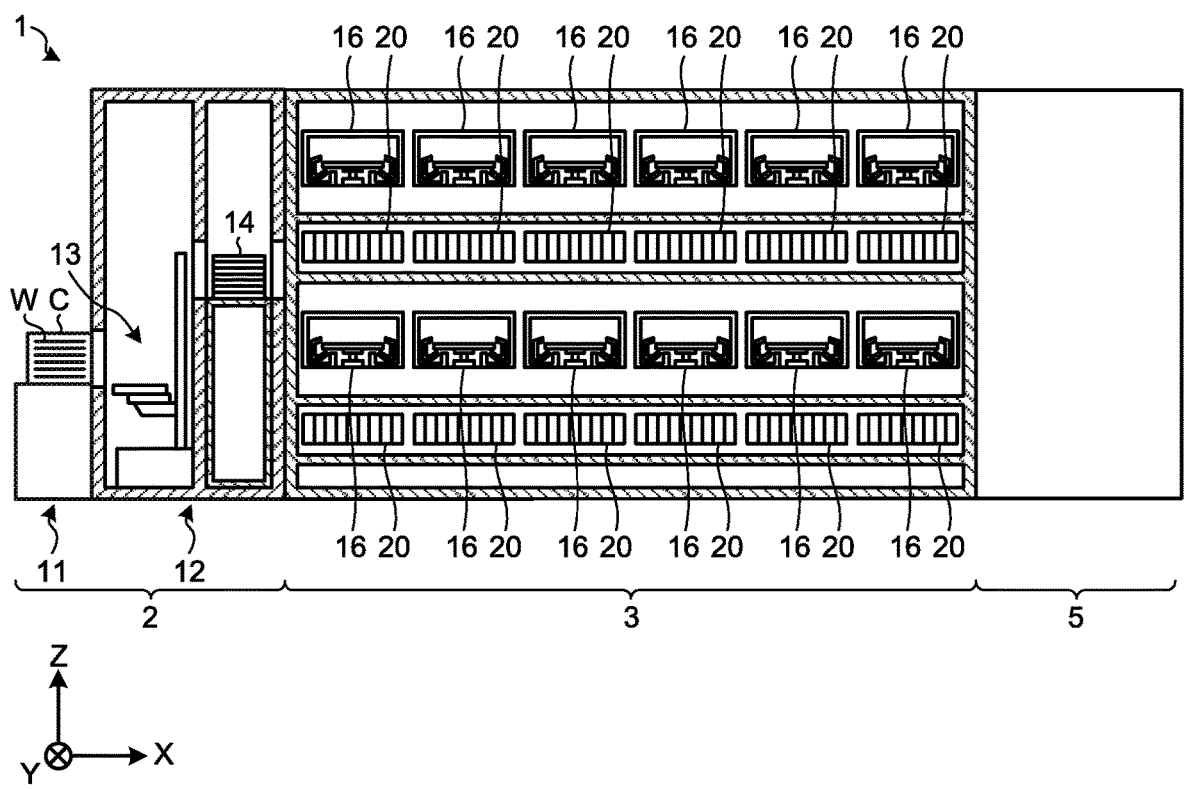
FIG. 3 is a diagram illustrating an arrangement of an external housing.

FIG. 3 is a diagram illustrating an arrangement of the external housing. As illustrated in FIG. 3, an external housing 5 is provided to be adjacent to the processing station 3 on a rear side (positive X-axis side) of the processing station 3.

The processing station 3 accommodates the plurality of processing units 16 in a state where the processing units 16 are arranged at two upper and lower steps. Each of the processing units 16 accommodates a valve box 20 at a lower portion of the corresponding processing unit 16. The valve box 20 accommodates the above-mentioned first flow control unit 76, the second flow control unit 86, the third flow control unit 66, and the fourth flow control unit 96 among other things.

Figure 4:
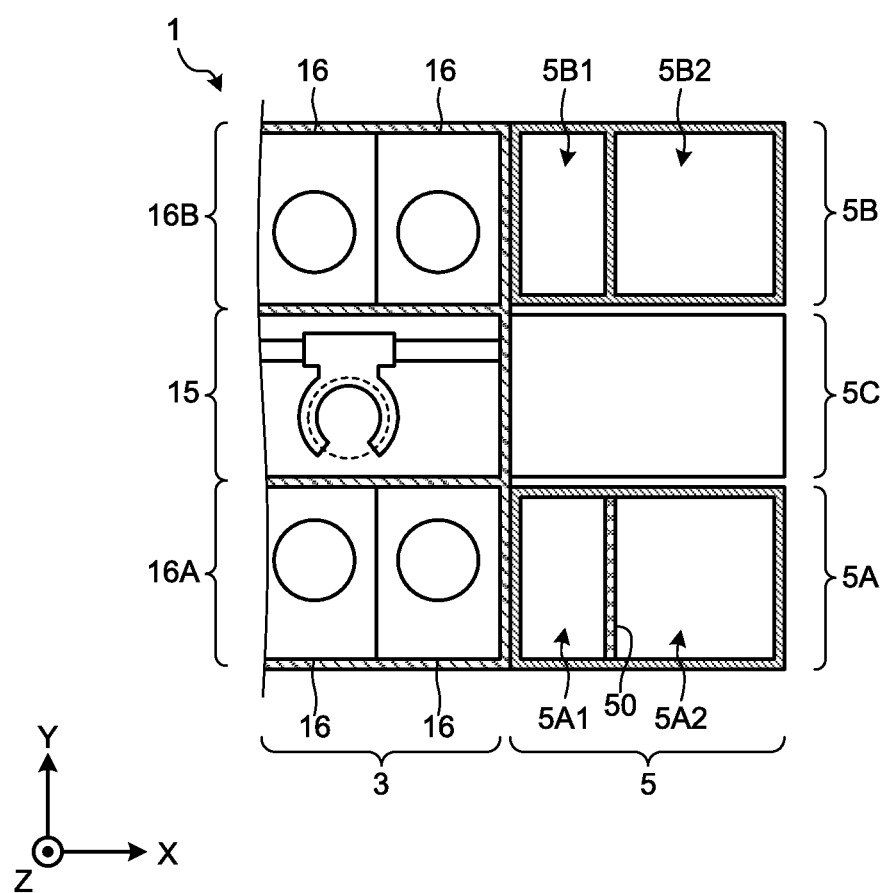
FIG. 4 is a diagram illustrating a configuration of the external housing.
Figure 5:
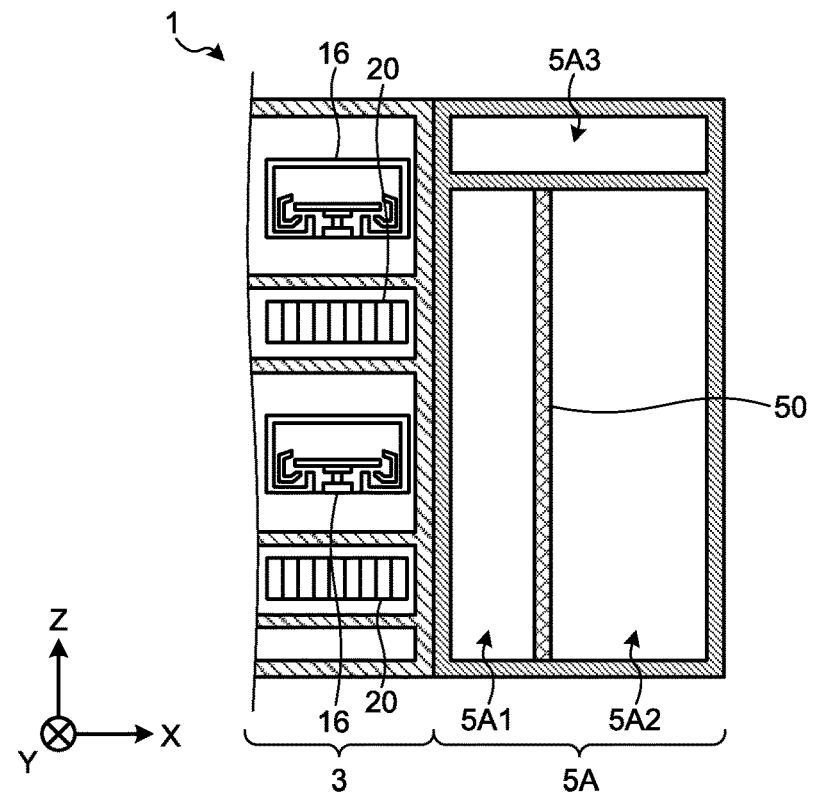
FIG. 5 is a diagram illustrating a configuration of the external housing.
Figure 6:
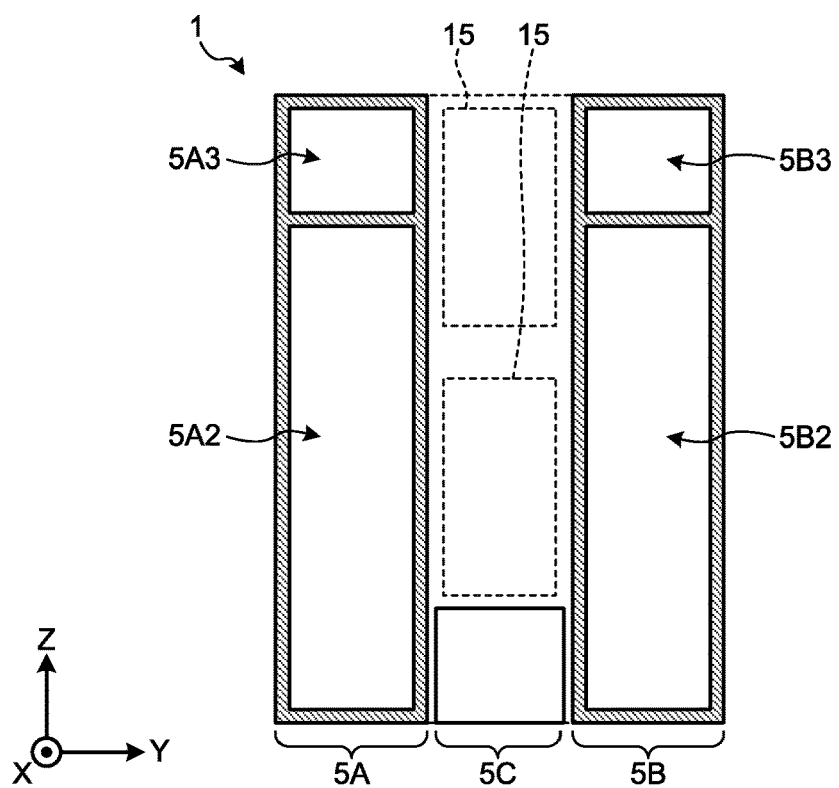
FIG. 6 is a diagram illustrating a configuration of the external housing.

FIGS. 4 to 6 are diagrams illustrating the configuration of the external housing 5. In FIGS. 4 to 6, cross-sectional views are schematically illustrated when the external housing 5 is viewed from its top (from positive Z-axis side), from its side (from negative Y-axis side), and from its back (from positive X-axis side).

Hereinafter, as illustrated in FIG. 4, among regions of the processing station 3 accommodating the plurality of processing units 16, a region provided on a front side (negative Y-axis side) of the substrate processing system 1 may be referred to as a "first processing block 16A", and a region provided on a back side (positive Y-axis side) of the substrate processing system 1 may be referred to as a "second processing block 16B". The processing station 3 is equivalent to one example of a "housing" that accommodates the plurality of processing units 16. The transfer section 15 is adjacent to the processing units 16 (equivalent to one example of "first processing unit") that are accommodated in the first processing block 16A and is further adjacent to the processing units 16 (equivalent to one example of "second processing unit") that are accommodated in the second processing block 16B, and is equivalent to one example of a "transfer section" that carries the wafer W into or out of the corresponding processing unit 16.

As illustrated in FIG. 4, the external housing 5 includes: a first supply block 5A (equivalent to one example of "supply block") that is adjacent to the first processing block 16A; a second supply block 5B that is adjacent to the second processing block 16B; and an interface block 5C that is adjacent to the transfer section 15.

The first processing block 16A, the transfer section 15, and the second processing block 16B of the processing station 3 are aligned in a direction (Y-axis direction) perpendicular to the direction (X-axis direction) in which the processing units 16 are aligned. The first supply block 5A, the interface block 5C, and the second supply block 5B of the external housing 5 are also aligned in a similar alignment direction of the first processing block 16A, the transfer section 15, and the second processing block 16B.

Therefore, the first supply block 5A is adjacent to the first processing block 16A and the interface block 5C, and the interface block 5C is adjacent to the transfer section 15, the first supply block 5A, and the second supply block 5B. The second supply block 5B is adjacent to the second processing block 16B and the interface block 5C.

The first supply block 5A accommodates a device (first device) used for supplying DIW that is processing liquid having the normal temperature, and a device (second device) used for supplying sulfuric acid that is processing liquid having the high temperature. The first supply block 5A according to the present embodiment includes a partition wall 50 that is interposed between the device used for supplying DIW and the device for supplying sulfuric acid.

Specifically, the partition wall 50 segments the first supply block 5A into a first region 5A1 that is close to the first processing block 16A and a second region 5A2 that is further than the first region 5A1 from the first processing block 16A. The device used for supplying DIW is arranged in the first region 5A1, and the device used for supplying sulfuric acid is arranged in the second region 5A2.

As described above, the partition wall 50 is provided between the device used for supplying DIW and the device used for supplying sulfuric acid. Thus, it is possible to reduce thermal effects between the device used for supplying DIW and the device used for supplying sulfuric acid.

The first supply block 5A also accommodates a device used for supplying HDIW (third device) in the first region 5A1. This point will be mentioned later.

The second supply block 5B accommodates the device used for supplying DIW, the device used for supplying HDIW, and the device used for supplying hydrogen peroxide. Specifically, the device used for supplying DIW and the device used for supplying HDIW are arranged in a first region 5B1 that is close to the second processing block 16B. The device used for supplying hydrogen peroxide is arranged in a second region 5B2 that is further from the second processing block 16B than the first region 5B1.

Here, it is assumed that no partition wall is provided between the first region 5B1 and the second region 5B2; however, a partition wall similar to the partition wall 50 may be provided between the first region 5B1 and the second region 5B2.

As illustrated in FIGS. 5 and 6, the first supply block 5A further includes an electrical device block 5A3 that is arranged on the first region 5A1 and the second region 5A2. Similarly thereto, the second supply block 5B further includes an electrical device block 5B3 that is arranged on the first region 5B1 and the second region 5B2. The electrical device blocks 5A3 and 5B3 accommodate the control device 4, for example.

The controller 18 (see FIG. 1) of the control device 4 is a Central Processing Unit (CPU), for example, and reads out and executes a program (not illustrated) stored in the storage 19 to control the processing units 16 and other devices. The controller 18 may be constituted of only the hardware without any program.

4. Configuration of Supply System of Sulfuric Acid

Figure 7:
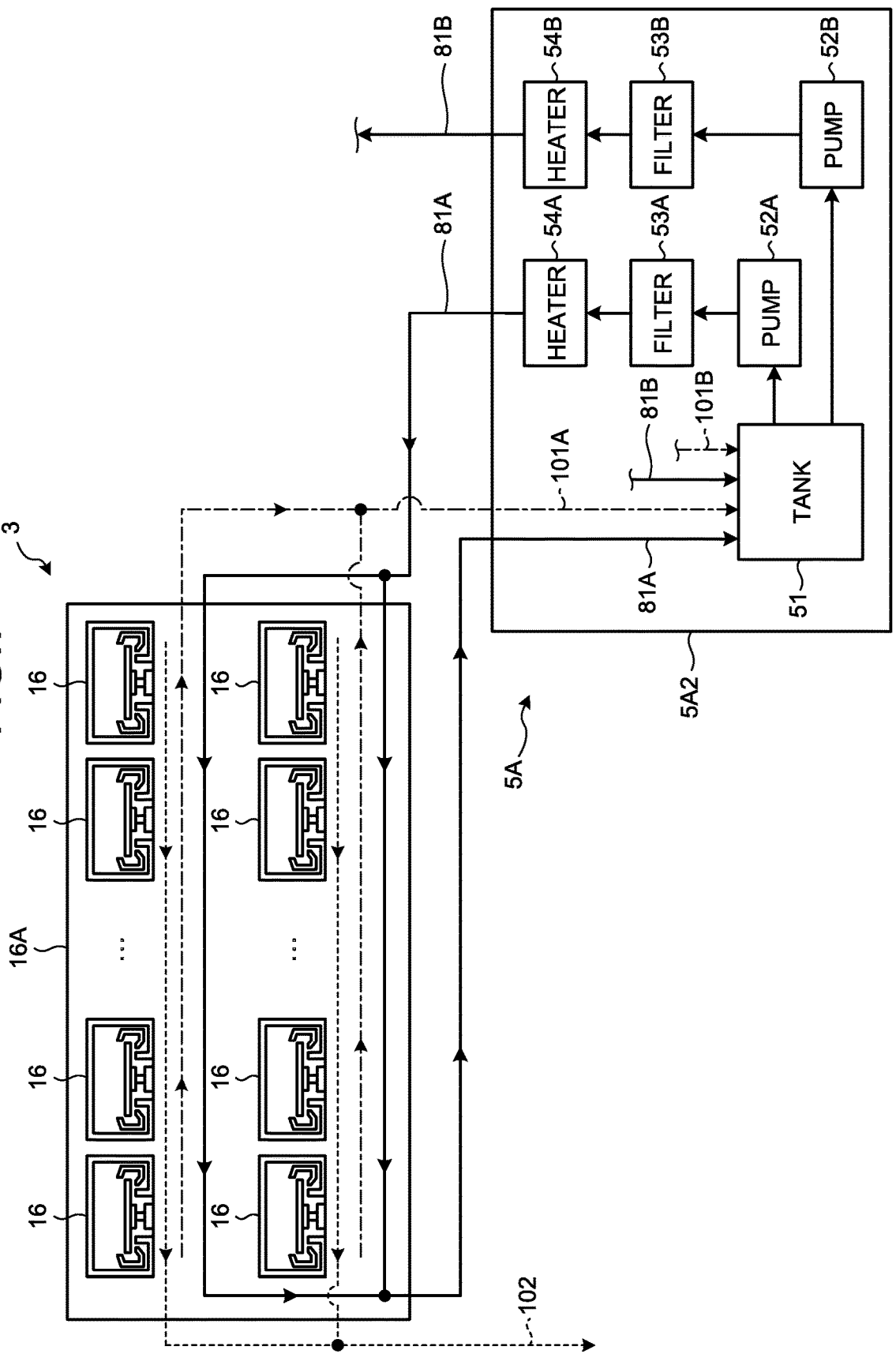
FIG. 7 is a diagram illustrating a configuration of a supply system of sulfuric acid.

Next, a supply system of sulfuric acid that is processing liquid having the high temperature will be explained with reference to FIG. 7. FIG. 7 is a diagram illustrating the configuration of the supply system of sulfuric acid.

As illustrated in FIG. 7, the supply system of sulfuric acid includes a primary second main pipe 81A and a secondary second main pipe 81B. The supply system of sulfuric acid includes a tank 51, pumps 52A and 52B, filters 53A and 53B, and heaters 54A and 54B.

The primary second main pipe 81A is equivalent to one example of a "primary second supply route" and a "second supply route", and the secondary second main pipe 81B is equivalent to one example of a "secondary second supply route" and the "second supply route". The pump 52A is equivalent to one example of a "first pump" and a "pump", and the pump 52B is equivalent to one example of a "second pump" and the "pump". The filter 53A is equivalent to one example of a "first filter" and a "filter", and the filter 53B is equivalent to one example of a "second filter" and the "filter". The heater 54A is equivalent to one example of a "first heater" and a "heater", and the heater 54B is equivalent to one example of a "second heater" and the "heater".

The primary second main pipe 81A is a supply route for supplying sulfuric acid to the plurality of processing units 16 accommodated in the first processing block 16A. The secondary second main pipe 81B is a supply route for supplying sulfuric acid to the plurality of processing units 16 accommodated in the second processing block 16B (see FIG. 4). Note that illustration of the second processing block 16B is omitted in FIG. 7.

One end and the other end of each of the primary second main pipe 81A and the secondary second main pipe 81B are connected with the tank 51 so that the primary second main pipe 81A and the secondary second main pipe 81B form respective circulation routes of sulfuric acid.

The primary second main pipe 81A is provided with the pump 52A, the filter 53A, and the heater 54A. The pump 52A, the filter 53A, and the heater 54A are arranged on a downstream side of the tank 51 in this order. The pump 52A sends sulfuric acid retained in the tank 51 to the primary second main pipe 81A. The filter 53A removes extraneous matter from sulfuric acid flowing through the primary second main pipe 81A. The heater 54A heats sulfuric acid flowing through the primary second main pipe 81A.

The secondary second main pipe 81B is provided with the pump 52B, the filter 53B, and the heater 54B on the downstream side of the tank 51 in this order. Configurations of the pump 52B, the filter 53B, and the heater 54B are similar to the above-mentioned configurations of the pump 52A, the filter 53A, and the heater 54A.

The first supply block 5A accommodates, in the second region 5A2, the tank 51, the pumps 52A and 52B, the filters 53A and 53B, and the heaters 54A and 54B.

The tank 51 is connected with recovery pipes 101A and 101B. The recovery pipe 101A is connected with the main discharge pipe 100 (see FIG. 2) of the processing units 16 that are accommodated in the first processing block 16A. The recovery pipe 101B is connected with the main discharge pipe 100 of the processing units 16 that are accommodated in the second processing block 16B. The recovery pipes 101A and 101B returns, to the tank 51, SPM recovered from the processing units 16.

The tank 51 is connected with a replenish pipe (not illustrated) that replenishes the tank 51 with a fresh sulfuric acid.

The first processing block 16A and the second processing block 16B are provided with the discharge pipe 102. The discharge pipe 102 is connected with the main discharge pipes 100 (see FIG. 2) of the processing units 16 so as to discharge SPM having used by the processing units 16 to the outside of the substrate processing system 1.

5. Arrangements of Devices in First Supply Block

Figure 8:
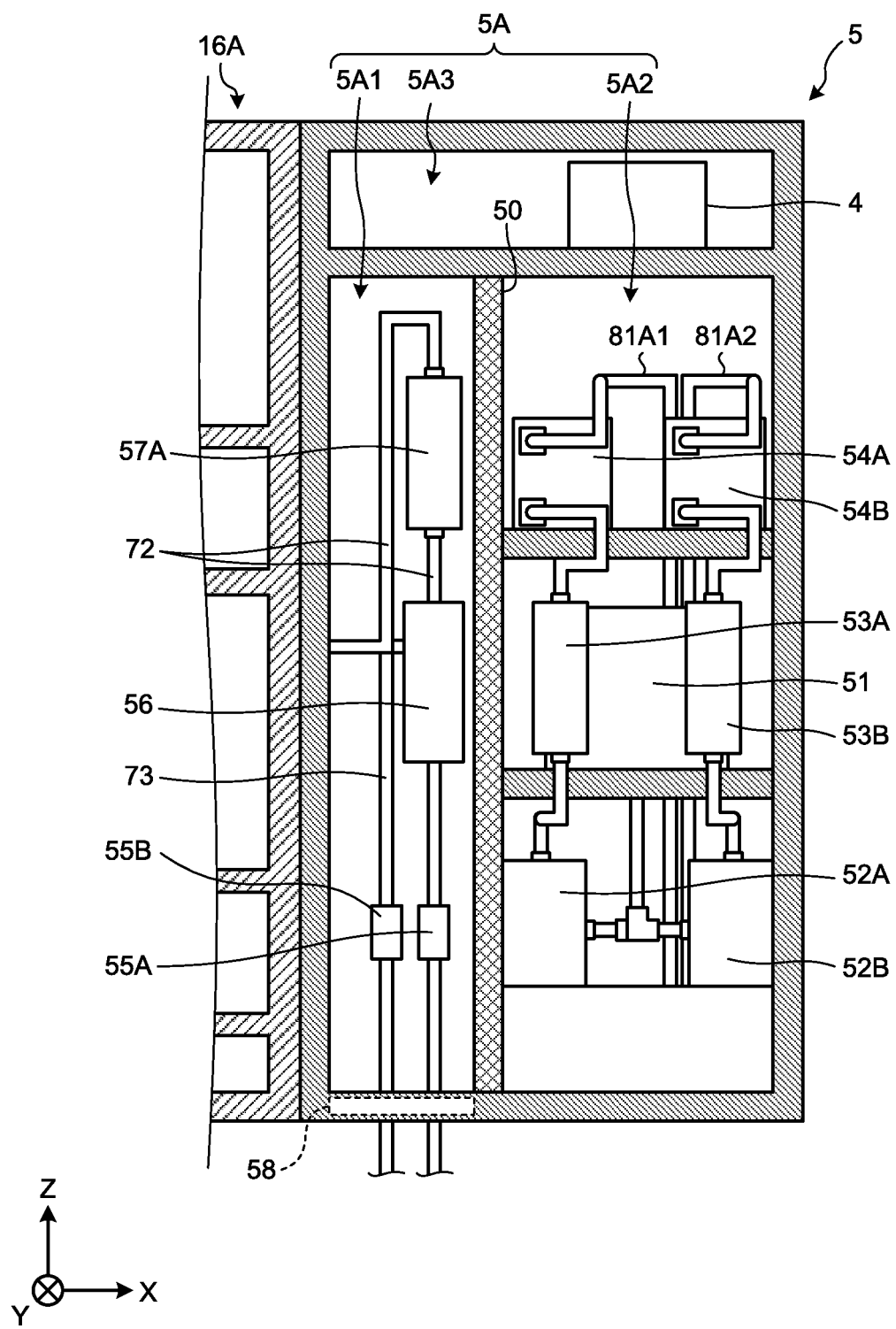
FIG. 8 is a diagram illustrating arrangements of devices in a first supply block.
Figure 9:
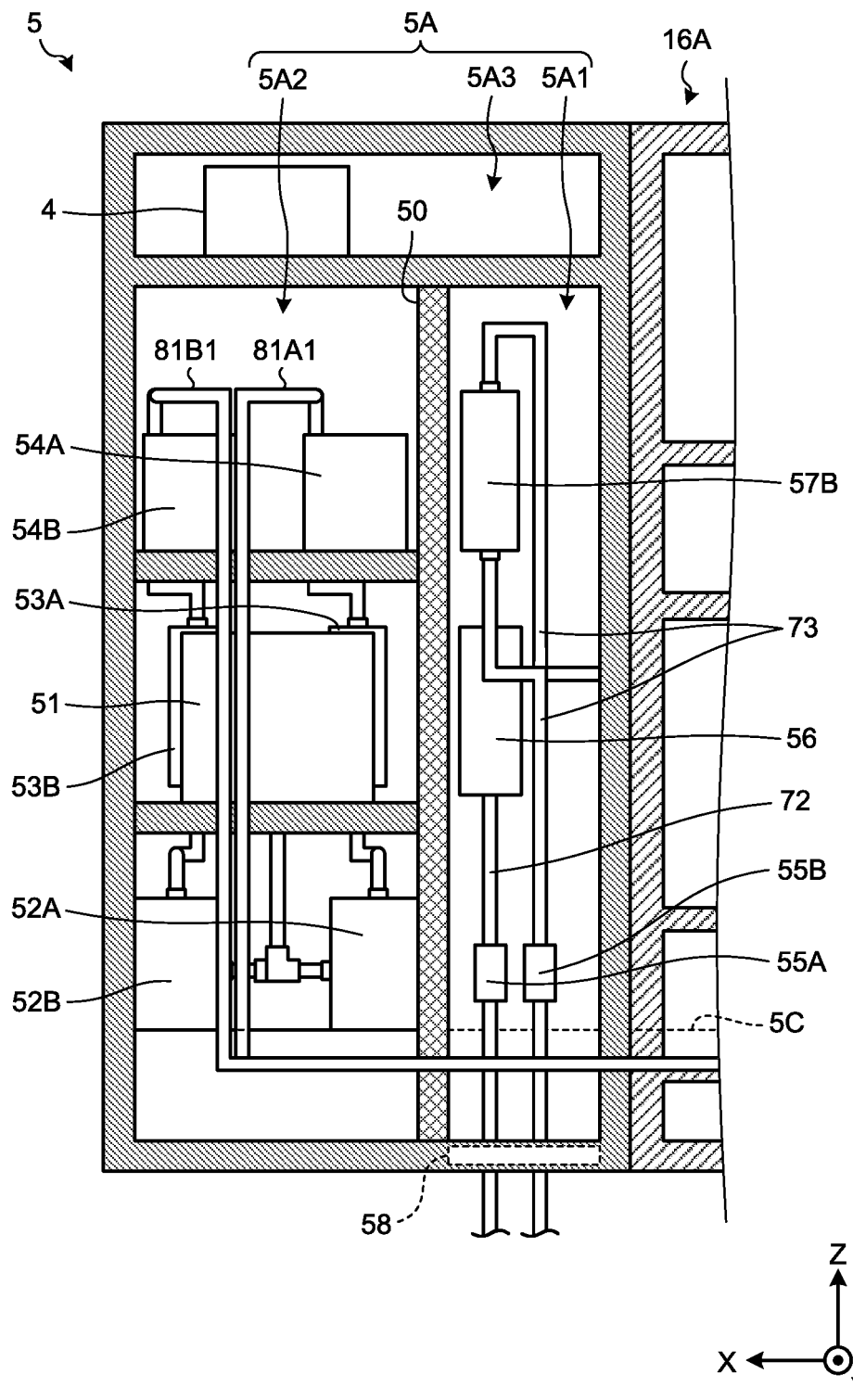
FIG. 9 is a diagram illustrating arrangements of the devices in the first supply block.

Next, arrangements of devices in the first supply block 5A will be explained with reference to FIGS. 8 and 9. FIGS. 8 and 9 are diagrams illustrating the arrangements of the devices in the first supply block 5A. In FIGS. 8 and 9, schematic views are illustrated when the first supply block 5A is viewed from the negative Y-axis side and the positive Y-axis side, respectively.

As illustrated in FIGS. 8 and 9, the second region 5A2 of the first supply block 5A is segmented into three steps along the height direction. A lower stage of the second region 5A2 accommodates the pumps 52A and 52B, a middle stage thereof accommodates the tank 51 and the filters 53A and 53B, and an upper stage thereof accommodates the heaters 54A and 54B.

The tank 51 is placed in a central portion of the middle stage of the second region 5A2. The pump 52A, the filter 53A, and the heater 54A are aligned in the height direction; the pump 52B, the filter 53B, and the heater 54B are aligned in the height direction; and they are symmetrically arranged with respect to the vertical axis passing through the central portion (namely, central portion of second region 5A2) of the tank 51.

As described above, the devices corresponding to the first processing block 16A and the devices corresponding to the second processing block 16B are symmetrically arranged with respect to the tank 51, and thus it is possible to reduce unevenness between pipe lengths of the primary second main pipe 81A and the secondary second main pipe 81B.

As illustrated in FIG. 9, in the second region 5A2, a flow path 81A1 of the primary second main pipe 81A that is on a downstream side from the heater 54A and a flow path 81B1 of the secondary second main pipe 81B that is on a downstream side from the heater 54B are arranged close to each other in a position that is further from the first processing block 16A than the vertical axis passing through the central portion of the tank 51.

As described above, the flow paths 81A1 and 81B1 are arranged away from the first processing block 16A and the first region 5A1 as much as possible. Thus, it is possible to reduce thermal effects on the first processing block 16A and the first region 5A1. The flow paths 81A1 and 81B1 are arranged close to each other to the extent that there exists no difference between temperature effects received by the flow paths 81A1 and 81B1 from the peripheral atmosphere, and then the flow paths 81A1 and 81B1 are extended along the vertical direction from the upper stage to the lower stage of the second region 5A2.

The first region 5A1 accommodates a valve 55A, a bubbler 56, and a filter 57A; as the devices used for supplying DIW. The valve 55A is a valve that adjusts the flow rate of DIW flowing through the first main pipe 72, and is used for stopping the supply of DIW to the first processing block 16A during maintenance, for example. The bubbler 56 dissolves gas, such as a carbon dioxide gas, into DIW flowing through the first main pipe 72. The filter 57A removes extraneous matter from DIW flowing through the first main pipe 72.

The valve 55A, the bubbler 56, and the filter 57A are aligned in the height direction. Specifically, the valve 55A, the bubbler 56, and the filter 57A are aligned in this order from below. Specifically, the valve 55A is provided at a position corresponding to the lower stage of the second region 5A2 in which the pumps 52A and 52B are arranged, and the bubbler 56 is arranged at a position corresponding to the middle stage of the second region 5A2 in which the tank 51 and the filters 53A and 53B are arranged. The filter 57A is arranged at a position corresponding to the upper stage of the second region 5A2 in which the heaters 54A and 54B are arranged.

A drain pan 58 is arranged at the lower portion of the first region 5A1. The drain pan 58 is a saucer-shaped member that receives a water droplet leaking from the first main pipe 72 or the third main pipe 73 to be mentioned later.

As described above, in the substrate processing system 1 according to the present embodiment, the first supply block 5A collectively accommodate the devices used for supplying sulfuric acid to the first supply block 5A and the devices used for supplying sulfuric acid to the second supply block 5B, in addition to the tank 51 that retains sulfuric acid. Thus, it is possible to improve space saving (reduction in footprint) compared with the case of a conventional liquid processing apparatus.

As described above, in the first supply block 5A according to the present embodiment, the partition wall 50 spatially separates the first region 5A1 accommodating the devices used for supplying DIW and the second region 5A2 accommodating the devices used for supplying sulfuric acid from each other. Thus, it is possible to reduce thermal effects between the device for supplying DIW that is processing liquid having the normal temperature and the device for supplying sulfuric acid that is processing liquid having the high temperature.

Therefore, by employing the substrate processing system 1 according to the present embodiment, it is possible to reduce thermal effects between the devices for supplying the processing liquids that are accommodated in the same external housing.

The first region 5A1 further accommodates, as the devices for supplying HDIW, a valve 55B and a filter 57B (equivalent to one example of "third device": see FIG. 9). The valve 55B and the filter 57B are arranged at positions having heights similar to those of the valve 55A and the filter 57A, respectively. The first region 5A1 may further accommodate a device used for supplying another processing liquid (for example, ozonized water).

In the first region 5A1, a mechanism that generates an air flow inside the region may be provided. For example, an intake port for sucking gas having the normal temperature may be provided close to the upper panel on which the electrical device block 5A3 is placed, and an exhaust port may be provided on a bottom panel in which the drain pan 58 is arranged so as to form an air flow that flows downward. Thus, heat accumulation inside the first region 5A1 is more resolved, so that thermal effects on, for example, DIW are able to be reduced that is processing liquid having the normal temperature.

6. Arrangements of Main Pipes

Figure 10:
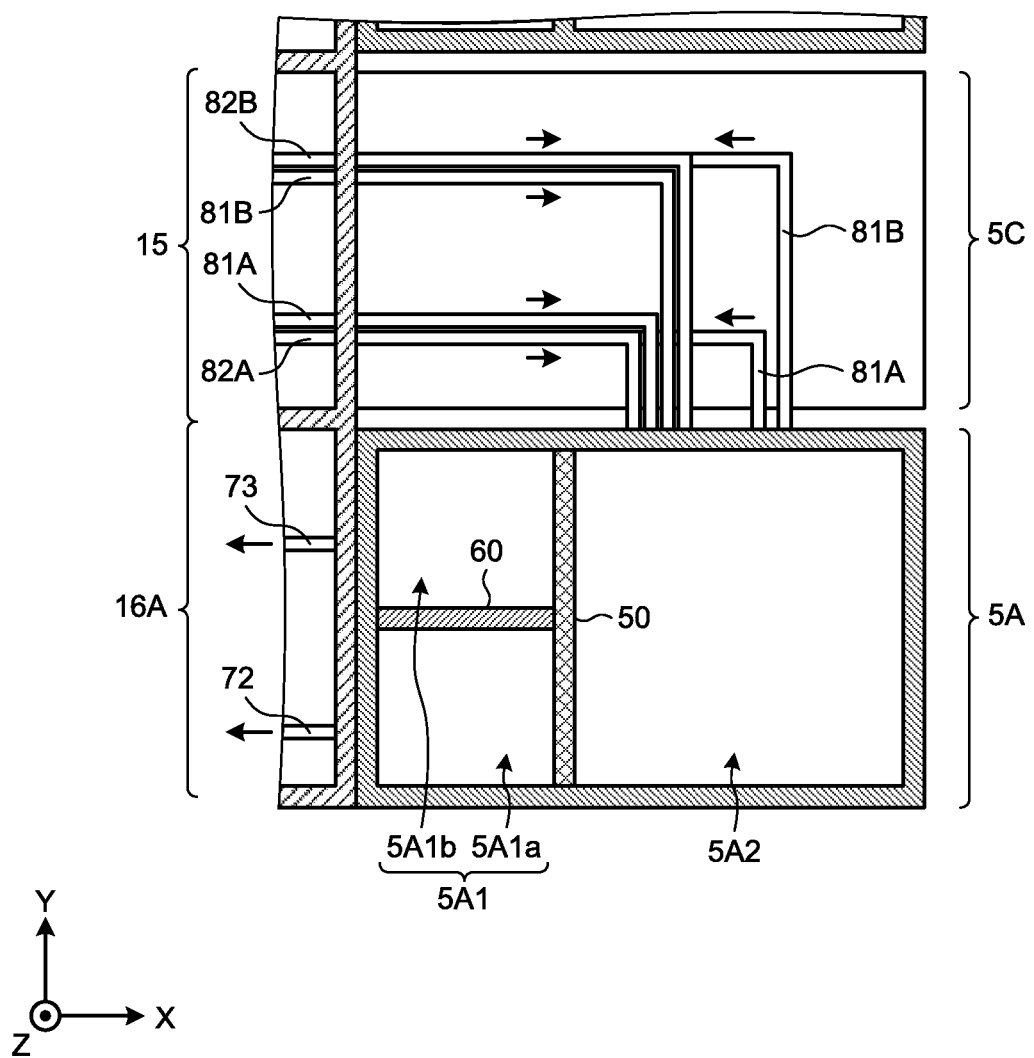
FIG. 10 is a diagram illustrating arrangements of main pipes.
Figure 11:
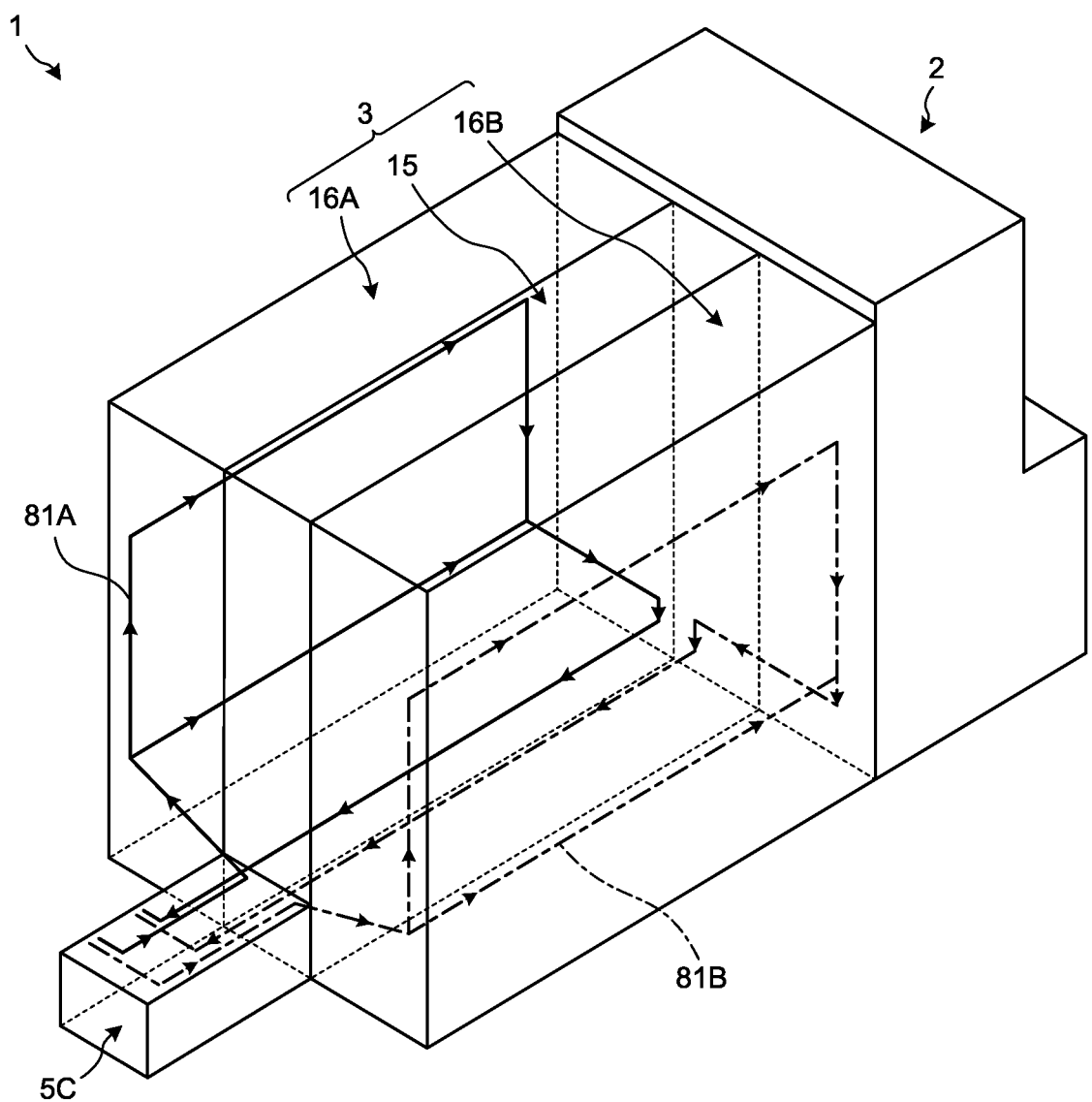
FIG. 11 is a diagram illustrating arrangements of a primary second main pipe and a secondary second main pipe.

Next, arrangements of the primary second main pipe 81A, the secondary second main pipe 81B, the first main pipe 72, and the third main pipe 73 will be explained with reference to FIGS. 10 and 11. FIG. 10 is a diagram illustrating arrangements of the main pipes. FIG. 11 is a diagram illustrating arrangements of the primary second main pipe 81A and the secondary second main pipe 81B. Note that illustration of the first supply block 5A and the second supply block 5B is omitted in FIG. 11.

As illustrated in FIG. 10, the primary second main pipe 81A and the secondary second main pipe 81B are connected to the processing station 3 via the first supply block 5A and the interface block 5C in this order. Specifically, the primary second main pipe 81A is connected to the processing units 16, which are accommodated in the first processing block 16A, via the interface block 5C and the transfer section 15. The secondary second main pipe 81B is connected to the processing units 16, which are accommodated in the second processing block 16B, via the interface block 5C and the transfer section 15.

On the other hand, the first main pipe 72 and the third main pipe 73 are connected to the processing units 16, which are accommodated in the first processing block 16A, without going through the interface block 5C and the transfer section 15.

As described above, routes to the first processing block 16A and the second processing block 16B of DIW that is processing liquid having the normal temperature are different from those of sulfuric acid that is processing liquid having the high temperature. Thus, it is possible to more reduce the thermal effects between these processing liquids.

As described above, the primary second main pipe 81A and the secondary second main pipe 81B are circulation routes, the primary second main pipe 81A returns to the first supply block 5A from the first processing block 16A via the transfer section 15 and the interface block 5C, and the secondary second main pipe 81B returns to the first supply block 5A from the second processing block 16B via the transfer section 15 and the interface block 5C. As described above, returning portions of the circulation routes of sulfuric acid are different from the supply routes of DIW. Thus, it is possible to more reduce the above-mentioned thermal effects.

As illustrated in FIG. 11, the primary second main pipe 81A and the secondary second main pipe 81B respectively enter and exit the first processing block 16A and the second processing block 16B from and to the transfer section 15 that is arranged between the first processing block 16A and the second processing block 16B. Thus, it is possible to reduce unevenness between pipe lengths of the primary second main pipe 81A and the secondary second main pipe 81B while collecting the pump 52A etc. corresponding to the first processing block 16A and the pump 52B etc. corresponding to the second processing block 16B into the first supply block 5A.

As illustrated in FIG. 10, a partition wall 60 (equivalent to one example of "second partition wall") spatially segments the first region 5A1 of the first supply block 5A into a primary first region 5A1a on the negative Y-axis side and a secondary first region 5A1b on the positive Y-axis side. The primary first region 5A1a accommodates the valve 55A, the bubbler 56, and the filter 57A, which are used for supplying DIW, and the secondary first region 5A1b accommodates the valve 55B and the filter 57B that are used for supplying HDIW.

As described above, the first supply block 5A according to the present embodiment further includes the partition wall 60 between the valve 55A, the bubbler 56, and the filter 57A; and the valve 55B and the filter 57B. Thus, it is further possible to reduce the thermal effects between DIW and HDIW.

As described above, the substrate processing system 1 (equivalent to one example of "liquid processing apparatus") according to the present embodiment includes: the plurality of processing units 16; the first main pipe 72 (equivalent to one example of "first supply route"); the valve 55A (equivalent to one example of "first device"); the second main pipe 81 (equivalent to one example of "second supply route"); the tank 51, the pumps 52A and 52B, the filters 53A and 53B, and the heaters 54A and 54B (equivalent to one example of "second device"); the processing station 3; and the external housing 5. Each of the processing units 16 processes the wafer W by using processing liquid including DIW and sulfuric acid. The first main pipe 72 is configured to supply DIW to the plurality processing units 16. The valve 55A adjusts a flow volume of DIW flowing through the first main pipe 72. The second main pipe 81 is configured to supply sulfuric acid to the plurality of processing units 16. The sulfuric acid has higher temperature than DIW. The tank 51 retains sulfuric acid. The pumps 52A and 52B send, to the second main pipe 81, sulfuric acid retained in the tank 51. The filters 53A and 53B remove extraneous matter from sulfuric acid flowing through the second main pipe 81. The heaters 54A and 54B heat sulfuric acid flowing through the second main pipe 81. The processing station 3 accommodates the plurality of processing units 16. The external housing 5 accommodates the valve 55A, the tank 51, the pumps 52A and 52B, the filters 53A and 53B, and the heaters 54A and 54B. The external housing 5 is adjacent to the processing station 3. The external housing 5 includes the partition wall 50 between "the valve 55A" and "the tank 51, the pumps 52A and 52B, the filters 53A and 53B, and the heaters 54A and 54B".

Therefore, by employing the substrate processing system 1 according to the present embodiment, it is possible to reduce the thermal effects between the devices for supplying processing liquids that are accommodated in the same external housing.

In the embodiment described above, DIW is employed as one example of the first processing liquid, sulfuric acid is employed as one example of the second processing liquid, and HDIW is employed as one example of the third processing liquid; however, the first to third processing liquids are not limited to the above-mentioned examples. In the embodiment described above, the example is explained in which the substrate processing system 1 includes the plurality of processing units 16; however, the substrate processing system 1 may have a configuration including only the one processing unit 16.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

REFERENCE SIGNS LIST

W Wafer
1 Substrate processing system
2 Carry-in/out station
3 Processing station
4 Control device
5 External housing
5A First supply block
5A1 First region
5A2 Second region
5B Second supply block
5C Interface block
16 Processing unit
50 Partition wall
51 Tank
52A, 52B Pump
53A, 53B Filter
54A, 54B Heater
71 Fourth main pipe
72 First main pipe
73 Third main pipe
81 Second main pipe
81A Primary second main pipe
81B Secondary second main pipe
101 Recovery pipe
102 Discharge pipe

What is claimed is:

1. A liquid processing apparatus comprising:
a processing unit that processes a substrate by using processing liquid including first and second processing liquids;
a first supply route configured to supply the first processing liquid to the processing unit;
a first device that is used for supplying the first processing liquid to the first supply route;
a second supply route configured to supply the second processing liquid to the processing unit, the second processing liquid having higher temperature than the first processing liquid;
a second device that is used for supplying the second processing liquid to the second supply route;
a housing that accommodates the processing unit; and
an external housing that accommodates the first and second devices, the external housing being adjacent to the housing, wherein
the external housing includes a partition wall between the first and second devices.

2. The liquid processing apparatus according to claim 1, wherein
the processing unit includes first and second processing units,
the housing includes a transfer section in which carrying the substrate into or out of the first and second processing units is performed, the transfer section being adjacent to the first and second processing units, and
the external housing is adjacent to the first processing unit.

3. The liquid processing apparatus according to claim 2, wherein the external housing includes:
  a supply block that is adjacent to the first processing unit; and
  an interface block that is adjacent to the transfer section and is further adjacent to the supply block,
the second supply route includes:
  a primary second supply route configured to supply the second processing liquid to the first processing unit; and
  a secondary second supply route configured to supply the second processing liquid to the second processing unit, and
the primary and secondary second supply routes are connected to the housing via the interface block.

4. The liquid processing apparatus according to claim 3, wherein
the first supply route is connected to the first processing unit without going through the interface block.

5. The liquid processing apparatus according to claim 1, wherein
the first device includes a valve that adjusts a flow rate of the first processing liquid flowing through the first supply route, and
the second device includes:
  a tank that retains the second processing liquid;
  a pump that sends, to the second supply route, the second processing liquid retained in the tank;
  a filter that removes extraneous matter from the second processing liquid flowing through the second supply route; and
  a heater that heats the second processing liquid flowing through the second supply route.

6. The liquid processing apparatus according to claim 5, wherein
the processing unit includes first and second processing units,
the second supply route includes:
  a primary second supply route configured to supply the second processing liquid to the first processing unit; and
  a secondary second supply route configured to supply second processing liquid to the second processing unit,
the pump includes:
  a first pump that sends, to the primary second supply route, the second processing liquid retained in the tank; and
  a second pump that sends, to the secondary second supply route, the second processing liquid retained in the tank,
the filter includes:
  a first filter that removes extraneous matter from the second processing liquid flowing through the primary second supply route; and
  a second filter that removes extraneous matter from the second processing liquid flowing through the secondary second supply route,
the heater includes:
  a first heater that heats the second processing liquid flowing through the primary second supply route; and
  a second heater that heats the second processing liquid flowing through the secondary second supply route, and
"the first pump, the first filter, and the first heater" and "the second pump, the second filter, and the second heater" are aligned in a height direction, and are symmetrically arranged with respect to each other while placing a vertical axis passing through the tank therebetween.

7. The liquid processing apparatus according to claim 6, wherein
a flow path of the primary second supply route on a downstream side from the first heater and a flow path of the secondary second supply route on a downstream side from the second heater are arranged, inside the external housing, close to each other in positions further than the vertical axis from the housing.

8. The liquid processing apparatus according to claim 1, wherein
the second supply route includes a circulation route.

9. The liquid processing apparatus according to claim 1, wherein
the external housing is segmented by the partition wall into a first region close to the housing and a second region further than the first region from the housing,
the first device is accommodated in the first region, and
the second device is accommodated in the second region.

10. The liquid processing apparatus according to claim 1, further comprising:
a third supply route configured to supply a third processing liquid to the processing unit, the third processing liquid having higher temperature than the first processing liquid and having lower temperature than the second processing liquid; and
a third device that is used for supplying the third processing liquid to the third supply route, wherein
the third device is arranged in a region of regions inside the external housing segmented by the partition wall, the region accommodating the first device, and
the external housing further includes a second partition wall between the first device and the third device.

11. The liquid processing apparatus according to claim 10, wherein
the first and third processing liquids include deionized water, and
the second processing liquid includes sulfuric acid.

12. The liquid processing apparatus according to claim 1, further comprising:
a mechanism configured to generate an airflow in a region accommodating the first device, the region being obtained by segmenting the external housing by using the partition wall.

* * * * *